(12) United States Patent
Saruban et al.

(10) Patent No.: US 9,013,859 B2
(45) Date of Patent: Apr. 21, 2015

(54) LAMINATED ELECTRONIC COMPONENT AND MANUFACTURING METHOD THEREFOR

(75) Inventors: Masahito Saruban, Nagaokakyo (JP);
Makoto Ogawa, Nagaokakyo (JP);
Akihiro Motoki, Nagaokakyo (JP);
Syunsuke Takeuchi, Nagaokakyo (JP);
Kiyoyasu Sakurada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1035 days.

(21) Appl. No.: 13/020,886

(22) Filed: Feb. 4, 2011

(65) Prior Publication Data
US 2011/0193448 A1   Aug. 11, 2011

(30) Foreign Application Priority Data
Feb. 5, 2010   (JP) .................. 2010-023707

(51) Int. Cl.
*H01G 4/228*   (2006.01)
*H01G 4/06*   (2006.01)
*H01G 4/30*   (2006.01)
*H01G 4/005*   (2006.01)
(Continued)

(52) U.S. Cl.
CPC .............. *H01G 4/30* (2013.01); *H01F 17/0013* (2013.01); *H01G 4/005* (2013.01); *H01G 13/00* (2013.01); *H01L 41/293* (2013.01)

(58) Field of Classification Search
CPC ..... H01G 4/302; H01G 4/008; H01G 4/1272; H01G 4/1227; H01G 4/0085; H01G 4/30; H01G 4/232; H01G 4/12

USPC ................. 361/321.1, 321.2, 321.3, 306.3
See application file for complete search history.

(56) References Cited

U.S. PATENT DOCUMENTS 6,134,098 A * 10/2000 Kuroda et al. ............ 361/321.2
6,960,366 B2   11/2005 Ritter et al.
(Continued)

FOREIGN PATENT DOCUMENTS

CN   1379421 A   11/2002
JP   63-169014 A   7/1988
(Continued)

OTHER PUBLICATIONS

Motoki et al., "Laminated Electronic Component and Method for Manufacturing the Same", U.S. Appl. No. 12/043,225, filed Mar. 6, 2008.

(Continued)

*Primary Examiner* — Eric Thomas
*Assistant Examiner* — Arun Ramaswamy
(74) *Attorney, Agent, or Firm* — Keating & Bennett, LLP

(57) ABSTRACT

A method for manufacturing a laminated electronic component in which, when first plating layers that respectively connect a plurality of internal electrodes to each other and second plating layers that improves the mountability of a laminated electronic component are formed as external terminal electrodes, the entire component main body is treated with a water repellent agent after the formation of the first plating layers, and the water repellent agent on the first plating layers is then removed before the formation of the second plating layers. The gaps between the end edges of the first plating films on the outer surface of the component main body and the outer surface of the component main body are filled with the water repellent agent.

4 Claims, 5 Drawing Sheets

(51) Int. Cl.
*H01G 13/00* (2013.01)
*H01F 17/00* (2006.01)
*H01L 41/293* (2013.01)

(56) References Cited

U.S. PATENT DOCUMENTS

| | | |
|---|---|---|
| 6,972,942 B2 | 12/2005 | Ritter et al. |
| 6,982,863 B2 | 1/2006 | Galvagni et al. |
| 7,067,172 B2 | 6/2006 | Ritter et al. |
| 7,152,291 B2 | 12/2006 | Ritter et al. |
| 7,154,374 B2 | 12/2006 | Ritter et al. |
| 7,161,794 B2 | 1/2007 | Galvagni et al. |
| 7,177,137 B2 | 2/2007 | Ritter et al. |
| 7,344,981 B2 | 3/2008 | Ritter et al. |
| 7,345,868 B2 | 3/2008 | Trinh |
| 7,463,474 B2 | 12/2008 | Ritter et al. |
| 2003/0007314 A1 | 1/2003 | Sanada et al. |
| 2005/0046536 A1 | 3/2005 | Ritter et al. |
| 2007/0014075 A1 | 1/2007 | Ritter et al. |
| 2008/0123248 A1 | 5/2008 | Kunishi et al. |
| 2008/0123249 A1 | 5/2008 | Kunishi et al. |
| 2008/0151470 A1* | 6/2008 | Motoki et al. ............ 361/303 |
| 2008/0158774 A1 | 7/2008 | Trinh |
| 2009/0279229 A1* | 11/2009 | Motoki et al. ............ 361/321.3 |
| 2009/0323253 A1* | 12/2009 | Kobayashi et al. ........ 361/301.4 |

FOREIGN PATENT DOCUMENTS

| | | |
|---|---|---|
| JP | 07-029773 A | 1/1995 |
| JP | 2002-289465 A | 10/2002 |
| JP | 2004-015016 A | 1/2004 |
| JP | 2004-146401 A | 5/2004 |
| JP | 2007-238931 A | 9/2007 |
| WO | 2007/119281 A1 | 10/2007 |

OTHER PUBLICATIONS

Motoki et al., "Laminated Electronic Component and Manufacturing Method Therefor", U.S. Appl. No. 12/781,058, filed May 17, 2010.
Ogawa et al., "Laminated Electronic Component and Manufacturing Method Therefor", U.S. Appl. No. 12/788,340, filed May 27, 2010.
Official Communication issued in corresponding Korean Patent Application No. 10-2011-0008325, mailed on Jan. 4, 2012.

* cited by examiner

LAMINATED ELECTRONIC COMPONENT AND MANUFACTURING METHOD THEREFOR

BACKGROUND OF THE INVENTION

1. Field of the Invention

The present invention relates to a laminated electronic component and a method for manufacturing the laminated electronic component, and more particularly, to a laminated electronic component including a plated external terminal electrode plated directly on the laminated electronic component so as to be electrically connected to a plurality of internal electrodes, and a method for manufacturing the laminated electronic component.

2. Description of the Related Art

As shown in FIG. 5, a laminated electronic component 101 defining a laminated ceramic capacitor is typically provided with a component main body 105 which includes a stacked structure including a plurality of stacked insulator layers 102 made of, for example, a dielectric ceramic and a plurality of layered internal electrodes 103 and 104 disposed along the interfaces between the insulator layers 102. The respective ends of the plurality of internal electrodes 103 and the plurality of internal electrodes 104 are respectively exposed at opposite end surfaces 106 and 107 of the component main body 105, and external terminal electrodes 108 and 109 are arranged so as to electrically connect the respective ends of the internal electrodes 103 to each other and electrically connect the respective ends of the internal electrodes 104 to each other.

For the formation of the external terminal electrodes 108 and 109, typically, a metal paste including a metal component and a glass component is applied onto the end surfaces 106 and 107 of the component main body 105, and then fired, thereby forming a paste electrode layer 110. Next, a first plating layer 111 including, for example, nickel as its main component is formed on the paste electrode layer 110, and a second plating layer 112 including, for example, tin or gold as its main component is formed on the first plating layer 112. More specifically, each of the external terminal electrodes 108 and 109 includes a three-layer structure of the paste electrode layer 110, the first plating layer 111, and the second plating layer 112.

The external terminal electrodes 108 and 109 are required to have favorable solderability when the laminated electronic component 101 is mounted on a substrate via solder. At the same time, the external terminal electrode 108 is required to have the function of electrically connecting the plurality of internal electrodes 103 to each other, which are electrically insulated from each other, and the external terminal electrode 109 is required to have the function of electrically connecting the plurality of internal electrodes 104 to each other, which are electrically insulated from each other. The second plating layers 112 ensure the solderability and the paste electrode layers 110 electrically connect the internal electrodes 103 to each other and the internal electrodes 104 to each other. The first plating layers 111 prevent solder erosion in the solder joint.

However, the paste electrode layer 110 has a large thickness, from several tens of μm to several hundreds of μm. Therefore, in order to limit the dimensions of the laminated electronic component 101 to certain specifications, the effective volume for providing a capacitance must be reduced because the thickness and volume of the paste electrode layers 110. On the other hand, the plating layers 111 and 112 have a thickness of only several μm. Thus, if the external terminal electrodes 108 and 109 can be defined by only the first plating layers 111 and the second plating layers 112, the effective volume for providing the capacitance can be increased.

For example, Japanese Unexamined Patent Publication No. 2004-146401 discloses a method in which a conductive paste is applied along at least ridge sections of end surfaces of a component main body in the direction of stacking internal electrodes so as to come into contact with leading sections of the internal electrodes, and the conductive paste is fired or thermally cured to form a conductive paste. Further, the end surfaces of the component main body are subjected to electroplating, thereby forming an electroplating film so as to be connected to the conductive film on the ridge sections described above. According to this method, the thickness of the external terminal electrodes at the end surfaces can be reduced.

In addition, Japanese Unexamined Patent Publication No. 63-169014 discloses a method in which a conductive metal film is deposited by electroless plating on the entire sidewall surface of a component main body, at which internal electrodes are exposed, so as to short circuit the internal electrodes exposed at the sidewall surface.

However, in the methods for forming external terminal electrodes as described in Japanese Unexamined Patent Publications No. 2004-146401 and No. 63-169014, plating is performed directly on the ends at which the internal electrodes are exposed. Thus, a plating solution is likely to enter the component main body along the interfaces between the internal electrodes and the insulator layers and may erode the ceramic defining the insulator layers and the internal electrodes, thereby causing structural defects. Furthermore, this results in defects in terms of reliability, such as degraded load characteristics against humidity for the laminated electronic component.

In particular, when tin or gold plating is to be applied, the problems described above are more likely to be caused because a tin or gold plating solution generally contains a highly corrosive complexing agent.

In order to solve the problems described above, for example, the International Publication No. WO2007/119281 discloses providing a water repellent agent on end surfaces of a component main body at which respective ends of internal electrodes are exposed, in order to fill the gaps at the interfaces between insulator layers and the internal electrodes with this water repellent agent, and then forming plating layers as bases of external terminal electrodes onto the end surfaces. Such a water repellent agent improves the lifetime characteristics in a load test against humidity.

However, the technique described in International Publication No. WO2007/119281 has the following problems.

The water repellent agent is likely to adhere to the ceramic sections defining the insulator layers, rather than the metal sections defining the internal electrodes. If the distance between the internal electrodes is large (that is, when the insulator layers are thick and when the number of stacked internal electrodes is small), most of the end surfaces at which the respective ends of the internal electrodes are exposed will be covered with the water repellent agent, which decreases the ability to deposit plating onto the end surfaces at which the internal electrodes are exposed.

In addition, in order to improve the fixing strength of the external terminal electrodes to the component main body, a heat treatment may be performed at a temperature of about 800° C. or more after the formation of the plating layers as bases. However, such a heat treatment will cause the water repellent agent to disappear.

It is to be noted that, for example, Japanese Unexamined Patent Publication No. 2002-289465 discloses providing a water repellent agent before a plating process when forming paste electrode layers by firing and then performing plating as in the prior art described with reference to FIG. 5, rather than forming external terminal electrodes substantially only by plating. The paste electrode layers formed by firing are not only formed on end surfaces of a component main body in the shape of a rectangular parallelepiped, at which respective ends of internal electrodes are exposed, but also formed so that the end edges of the paste electrode layers are located on the principal surfaces and side surfaces adjacent to the end surfaces.

However, the technique described in Japanese Unexamined Patent Publication No. 2002-289465 above encounters the following problem. Moisture is likely to enter from the gaps between the end edges of the paste electrode layers formed by firing and the component main body because segregation of a glass component is likely to occur in this section of the gaps and the glass is easily dissolved by the plating solution even if the glass is coated with the water repellent agent.

SUMMARY OF THE INVENTION

To overcome the problems described above, preferred embodiments of the present invention provide a method for manufacturing a laminated electronic component and a laminated electronic component manufactured in accordance with the manufacturing method described above.

A method for manufacturing a laminated electronic component according to a preferred embodiment of the present invention includes the steps of preparing a component main body having a stacked structure and including a plurality of internal electrodes formed therein and each of the internal electrodes being partially exposed, and forming an external terminal electrode on an outer surface of the component main body, the external terminal electrode electrically connected to the internal electrodes. In order to solve the technical problems described above, the step of forming the external terminal electrode preferably includes a step of forming a first plating layer on the exposed surfaces of the internal electrodes in the component main body, a step of applying a water repellent agent at least onto a surface of the first plating layer and onto a section on the outer surface of the component main body, the section including an end edge of the first plating layer, a step of removing the water repellent agent applied onto the surface of the first plating layer, and then a step of forming a second plating layer on the first plating layer.

The step of forming the external terminal electrode preferably further includes a step of applying a heat treatment to the component main body with the first plating layer formed thereon between the step of forming the first plating layer and the step of applying the water repellent agent.

Preferably, the step of forming the first plating layer includes a step of forming a plating layer including copper, for example, as its main component, and the step of forming the second plating layer includes a step of forming a plating layer including nickel, for example, as its main component and a subsequently performed step of forming a plating layer including tin or gold, for example, as its main component.

A laminated electronic component according to another preferred embodiment of the present invention includes a component main body having a stack structure and including a plurality of internal electrodes disposed therein, each of the internal electrodes being partially exposed, and an external terminal electrode electrically connected to the internal electrode and provided on an outer surface of the component main body. The external terminal electrode preferably includes a first plating layer provided on the exposed surfaces of the internal electrodes in the component main body, and a second plating layer provided on the first plating layer, and further preferably includes a water repellent agent filling a gap between an end edge of the first plating film on the outer surface of the component main body and the outer surface of the component main body.

In the laminated electronic component according to a preferred embodiment of the present invention, an interdiffusion layer is preferably provided in a region having a length of about 2 μm or more, for example, from a boundary between the internal electrode and the first plating layer.

Preferably, the first plating layer includes a plating layer including copper, for example, as its main component, and the second plating layer includes a plating layer including nickel, for example, as its main component, and a plating layer provided thereon including tin or gold, for example, as its main component.

Preferred embodiments of the present invention are particularly advantageously applied when the component main body has a substantially rectangular parallelepiped shape, for example, including a pair of principal surfaces opposed to each other, a pair of side surfaces opposed to each other, and a pair of end surfaces opposed to each other, the end surfaces serving as the exposed surfaces of the internal electrodes, and when the first plating layer is disposed on the end surfaces and such that end edges of the first plating layer are located on the principal surfaces and the side surfaces, which are adjacent to the end surfaces.

According to a preferred embodiment of the present invention, before the formation of the second plating layer after the formation of the first plating layer, the water repellent agent is applied, and the water repellent agent applied onto the surface of the first plating layer is removed. In this case, the water repellent agent remains so as to fill the gap between the end edge of the first plating layer on the outer surface of the component main body and the outer surface of the component main body.

Therefore, when the first plating layer is arranged to electrically connect the plurality of internal electrodes to each other, whereas the second plating layer is arranged to improve the mountability of the laminated electronic component, the water repellent agent is applied before the formation of the plating layer arranged to improve the mountability. Accordingly, a highly corrosive complexing agent used in a plating solution for, for example, tin plating or gold plating which improve the mountability is prevented from entering the inside of the component main body from the gap between the end edge of the first plating layer and the component main body, thereby effectively and sufficiently ensuring the reliability of the laminated electronic component.

In addition, the water repellent agent effectively prevents ingress of moisture from the gap between end edge of the first plating layer and the component main body. For example, in the case of the component main body having a substantially rectangular parallelepiped shape, when the first plating layer is formed on the end surface of the component main body such that the end edge of the first plating layer is located on the principal surface and side surface adjacent to the end surface, ingress of moisture is effectively prevented from the gap between the end edge of the first plating layer and the principal surface and side surface. This prevention of moisture ingress effectively and reliably improves the reliability of the laminated electronic component.

In addition, since the water repellent agent applied onto the surface of the first plating layer is removed before the formation of the second plating layer as described above, a condition is provided in which almost no water repellent agent is present on the surface of the first plating layer. Therefore, the problem of difficulty in depositing a plating film is less likely to be caused in the formation of the second plating layer. Furthermore, this enables the use of an agent having strong water repellency as the water repellent agent, thereby further improving the reliability.

When the component main body including the first plating layer formed thereon is subjected to a heat treatment between the step of forming the first plating layer and the step of applying the water repellent agent, the above-described problem of moisture ingress is more effectively and reliably prevented. In addition, the problem of disappearance of the water repellent agent due to the heat treatment does not occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
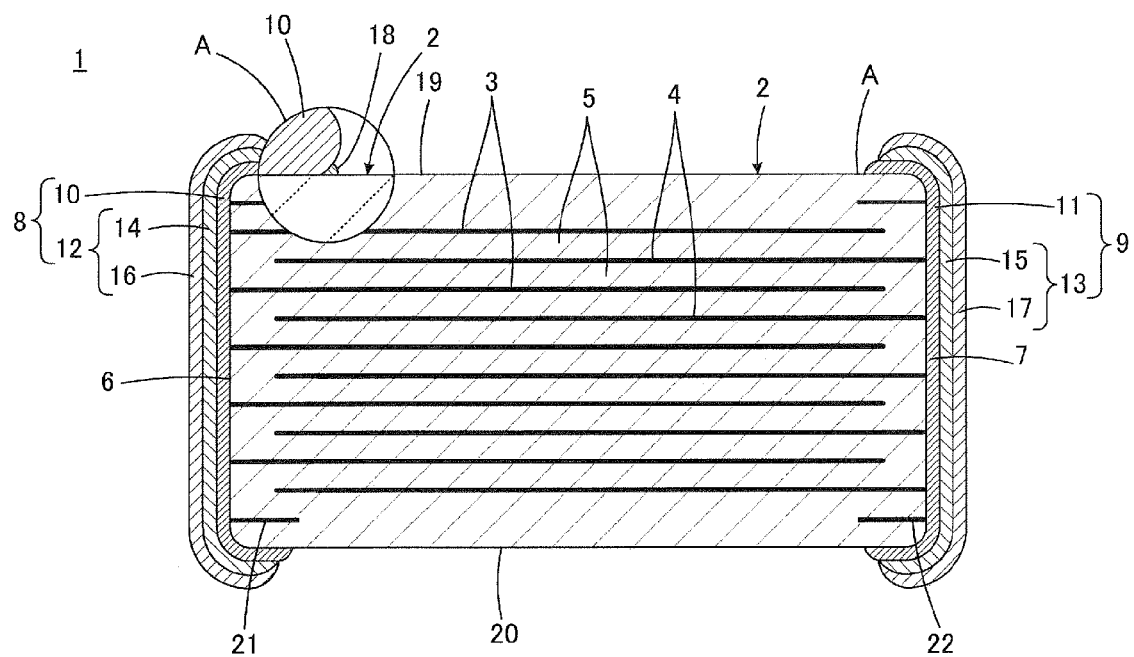
FIG. 1 is a cross-sectional view illustrating a laminated electronic component 1 manufactured in accordance with a manufacturing method according to a preferred embodiment of the present invention, which also shows an enlarged portion of the laminated electronic component 1.

In a method for manufacturing a laminated electronic component according to a preferred embodiment of the present invention, the formation of external terminal electrodes is preferably performed by direct plating onto exposed end surfaces of internal electrodes in a component main body, without forming any paste electrodes, sputtered electrodes, deposited electrodes, or other types of electrodes. Further, the plating film preferably includes at least two layers, and more preferably, includes a first plating layer which electrically connects a plurality of internal electrodes to each other and a second plating layer which improves the mountability of the laminated electronic component. According to a preferred embodiment of the present invention, after the formation of the first plating layer, a water repellent agent is applied at least onto the surface of the first plating layer and onto a section on the outer surface of the component main body at which an end edge of the first plating layer is located, and before the formation of the second plating layer, the water repellent agent applied onto the surface of the first plating layer is removed. FIG. 1 shows an example of the laminated electronic component.

Referring to FIG. 1, a laminated electronic component 1 includes a component main body 2 having a stack structure. The component main body 2 includes a plurality of internal electrodes 3 and 4 disposed therein. More specifically, the component main body 2 includes a plurality of stacked electrically insulating insulator layers 5 and a plurality of layered internal electrodes 3 and 4 arranged along the interfaces between the insulator layers 5.

When the laminated electronic component 1 defines a laminated ceramic capacitor, the insulator layers 5 are preferably made of a dielectric ceramic, for example. It is to be noted that the laminated electronic component 1 may define other elements such as an inductor, a thermistor, or a piezoelectric component, for example. Therefore, depending on the function of the laminated electronic component 1, the insulator layers 5 may preferably be made of a magnetic ceramic, a semiconductor ceramic, a piezoelectric ceramic, or other suitable material or may be made of a material including a resin, for example, instead of a dielectric ceramic.

The respective ends of the plurality of internal electrodes 3 and the plurality of internal electrodes 4 are exposed at two end surfaces 6 and 7 of the component main body 2, and external terminal electrodes 8 and 9 are respectively arranged so as to electrically connect the respective ends of the internal electrodes 3 to each other and electrically connect the respective ends of the internal electrodes 4 to each other.

It is to be noted that while the laminated electronic component 1 shown in FIG. 1 is preferably a two-terminal type component including the two external terminal electrodes 8 and 9, the present invention can also be applied to multi-terminal type laminated electronic components.

The respective external terminal electrodes 8 and 9 preferably include first plating layers 10 and 11 formed by plating directly on the exposed surfaces of the internal electrodes 3 and 4 in the component main body 2, that is, on the end surfaces 6 and 7, and second plating layers 12 and 13 formed on the first plating layers 10 and 11, respectively.

The first plating layers 10 and 11 are provided to electrically connect the plurality of internal electrodes 3 and 4 to each other, and are preferably made of a plating layer including copper, for example, as its main component. On the other hand, the second plating layers 12 and 13 are provided to improve the mountability of the laminated electronic component 1, and preferably respectively include solder barrier layers 14 and 15 made of a plating layer including, for example, nickel as its main component, and solderability providing layers 16 and 17 preferably made of a plating layer including, for example, tin or gold as its main component, which are formed on the solder barrier layers 14 and 15 so as to provide solderability. It is to be noted that the plating including tin as its main component also preferably includes, for example, Sn—Pb solder plating. In addition, the plating including nickel as its main component also preferably includes Ni—P plating by electroless plating.

When the first plating layers 10 and 11 are made of a plating layer including copper as its main component as described above, the favorable throwing power of copper improves the efficiency of the plating process and increases the fixing strength of the external terminal electrodes 8 and 9. However, the first plating layers 10 and 11 may be made of nickel, for example, and the second plating layers 12 and 13 may be made of tin or gold, for example.

The plating method for forming the first plating layers 10 and 11 and the second plating layers 12 and 13 may be an electroless plating method of depositing metal ions with the use of a reducing agent, or may be an electroplating method through an electrifying process, for example.

In FIG. 1, regarding a section A on the outer surface of the component main body 2 at which edges of the first plating films 10 and 11 are located, an enlarged portion of the section A is shown in which the end edge of the first plating film 10 is located. It is to be noted that the section A in which the end edge of the second plating film 11 is located is also substantially the same as the enlarged and shown section A in which the end edge of the first plating film 10 is located.

The gaps between the end edges of the first plating films 10 and 11 on the outer surface of the component main body 2 and the outer surface of the component main body 2 are filled with a water repellent agent 18. While the type of the water repellent agent 18 is not particularly limited as long as the water repellent agent 18 prevents ingress of a plating solution or moisture, for example, a silane coupling agent is preferred.

Next, a method for manufacturing the laminated electronic component 1 shown in FIG. 1, and in particular, a method for forming the external terminal electrodes 8 and 9 will be described.

First, the component main body 2 is prepared by a known method. Next, the external terminal electrodes 8 and 9 are formed respectively on the end surfaces 6 and 7 of the component main body 2 to electrically connect the internal electrodes 3 and 4 to each other.

For the formation of the external terminal electrodes 8 and 9, the first plating layers 10 and 11 are first formed on the end surfaces 6 and 7 of the component main body 2. In the component main body 2 before plating is applied, the plurality of internal electrodes 3 exposed at the one end surface 6 are electrically insulated from each other and the plurality of internal electrodes 4 exposed at the other end surface 7 are electrically insulated from each other. In order to form the first plating layers 10 and 11, metal ions in a plating solution are first deposited onto the exposed sections of each of the internal electrodes 3 and 4. Then, the plated deposits are further grown to physically connect the plated deposits on the respective exposed sections of the adjacent internal electrodes 3 to each other and the plated deposits on the respective exposed sections of the adjacent internal electrodes 4 to each other. In this manner, uniform and dense first plating layers 10 and 11 are formed.

In this preferred embodiment, the component main body 2 of the laminated electronic component 1 preferably has a substantially rectangular parallelepiped shape, for example, which includes a pair of principal surfaces 19 and 20 opposed to each other and a pair of side surfaces opposed to each other (not shown in FIG. 1) in addition to the pair of end surfaces 6 and 7 described above. Further, the first plating layers 10 and 11 are preferably formed on the pair of end surfaces 6 and 7, respectively, such that the end edges of the first plating layers 10 and 11 are located on the pair of principal surfaces 19 and 20 and the pair of side surfaces, which are adjacent to the end surfaces 6 and 7.

In order to enable the first plating layers 10 and 11 to be formed efficiently such that the end edges of the first plating layers 10 and 11 extend to the pair of principal surfaces 19 and 20 and the pair of side surfaces, as described above, internal dummy conductors 21 and 22 are preferably formed in an outer layer section of the component main body 2 so as to be exposed at the end surfaces 6 and 7. Furthermore, although not shown in the figure, external dummy conductors may preferably be formed on ends of the principal surfaces 19 and 20 of the component main body 2, which are adjacent to the end surfaces 6 and 7. The internal dummy conductors 21 and 22 and external dummy conductors do not substantially contribute to the development of electrical characteristics, but facilitate the deposition of metal ions for the formation of the first plating layers 10 and 11 improve the plating growth.

Furthermore, in order to adequately expose the internal electrodes 3 and 4 and the internal dummy conductors 21 and 22 at the end surfaces 6 and 7 before the plating step described above, it is preferable to perform polishing on the end surfaces 6 and 7 of the component main body 2. In this case, when polishing is performed to the extent that the respective exposed ends of the internal electrodes 3 and 4 and the internal dummy conductors 21 and 22 project from the end surfaces 6 and 7, the respective exposed ends will be spread in a planar direction, thereby reducing the energy required for the plating growth.

Figure 2:
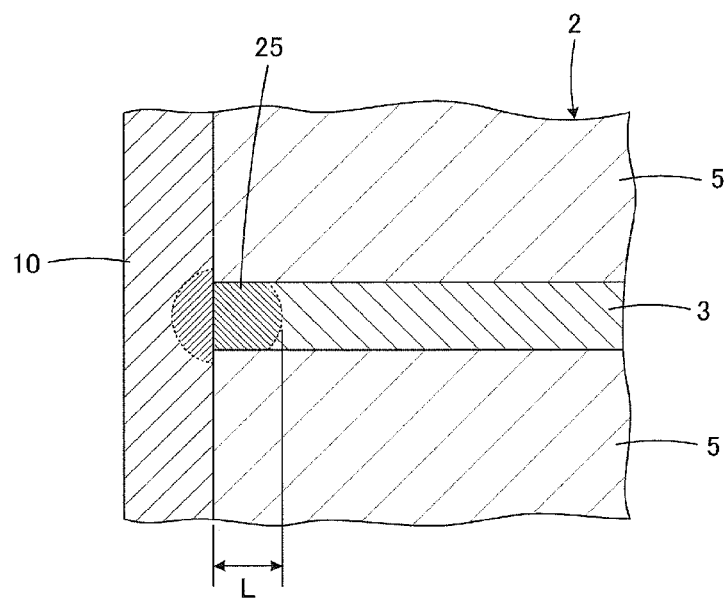
FIG. 2 is an enlarged cross-sectional view illustrating a section of a component main body 2 provided with a first plating layer 10 formed thereon and then subjected to a thermal treatment for the purpose of forming an external terminal electrode 8, in the manufacturing process of the laminated electronic component 1 shown in FIG. 1.

Next, the component main body 2 including the first plating layers 10 and 11 formed as described above is preferably subjected to a heat treatment. A heat treatment temperature, for example, of preferably about 600° C. or more, and more preferably about 800° C. or more is used. The state after this heat treatment is shown in FIG. 2. FIG. 2 shows the internal electrode 3 and the first plating layer 10. The structure on the internal electrode 4 and the first plating layer 11, not shown in FIG. 2, is substantially the same as the structure of the internal electrode 3 and the first plating layer 10, shown in FIG. 2, and the description thereof will be omitted accordingly.

Referring to FIG. 2, an interdiffusion layer 25 is formed between the internal electrode 3 and the first plating layer 10. The interdiffusion layer 25 is preferably present in a region with a length L of about 2 μm or more, for example, from the boundary between the internal electrode 3 and the first plating layer 10. In other words, the heat treatment is preferably performed under a condition such that the length L is about 2 μm or more, for example. The formation of such an interdiffusion layer 25 more effectively and reliably prevents the moisture from entering the inside of the component main body 2.

Figure 3:
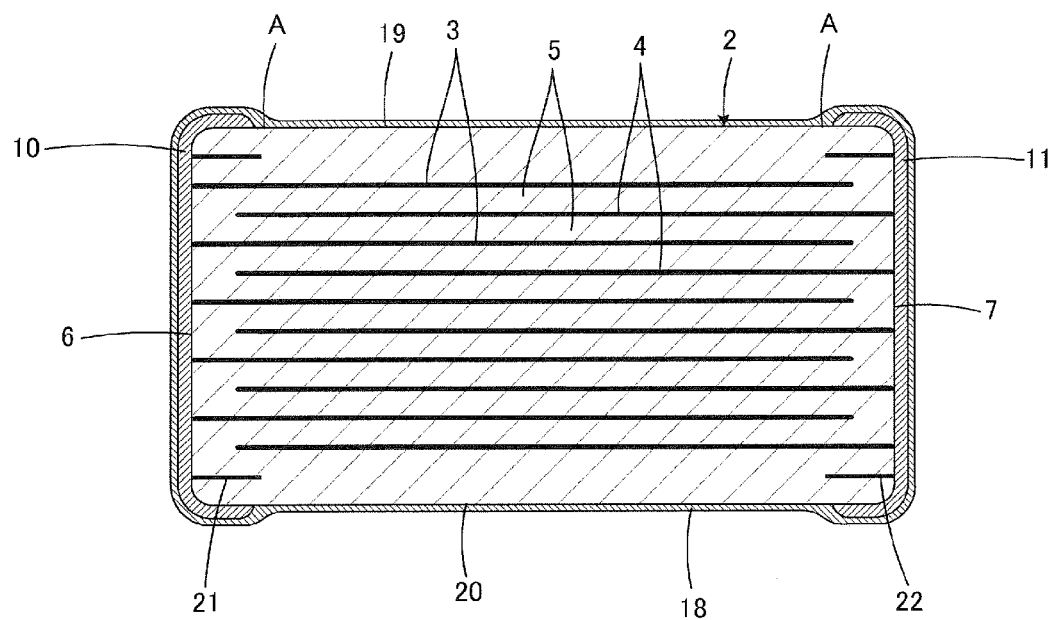
FIG. 3 is a cross-sectional view illustrating the component main body 2 with a water repellent agent applied thereto, in the manufacturing process of the laminated electronic component 1 shown in FIG. 1.

Next, the step described above of applying a water repellent agent 18 is performed. It is sufficient to apply the water repellent agent 18 at least onto the surfaces of the first plating layers 10 and 11 and onto a section of the external surface of the component main body 2 in which respective end edges of the first plating layers 10 and 11 are located. However, in this preferred embodiment, the water repellent agent 18 is preferably applied onto the entire surface of the component main body 2 with the first plating layers 10 and 11 formed thereon, as shown in FIG. 3, since the method of immersing the component main body 2 in a liquid including the water repellent agent 18 is preferably used to apply the water repellent agent 18. It is to be noted that other methods, such as a spraying method, for example, may be used to apply the water repellent agent 18.

Due to the shape of the outer surface of the component main body 2 with the first plating layers 10 and 11 formed thereon, the surface tension of the water repellent agent 18, and other factors, the water repellent agent 18 adheres onto the first plating layers 10 and 11 to form a relatively thin and uniform film and the water repellent agent 18 adheres to the section A on the principal surfaces 19 and 20 and side surfaces of the component main body 2 at which the end edges of the first plating layers 10 and 11 are located to form a relatively thick film. It is to be noted that while the film of the water repellent agent 18 is shown with a thickness that is exaggerated in FIG. 3, it should be understood that the thickness as shown in the figure is not actually achieved.

In addition, when a silane coupling agent is used as the water repellent agent 18 as described above, the silane coupling agent preferentially adheres to the ceramic surface because the silane coupling agent is strongly bonded to OH groups. On the other hand, a thin and uniform natural oxidation film is present on the surfaces of the first plating layers 10 and 11, thus enabling the water repellent agent 18 to be formed uniformly in a thin film on the natural oxidation film. This also contributes to the adherence of the water repellent agent 18 as described above.

Figure 4:
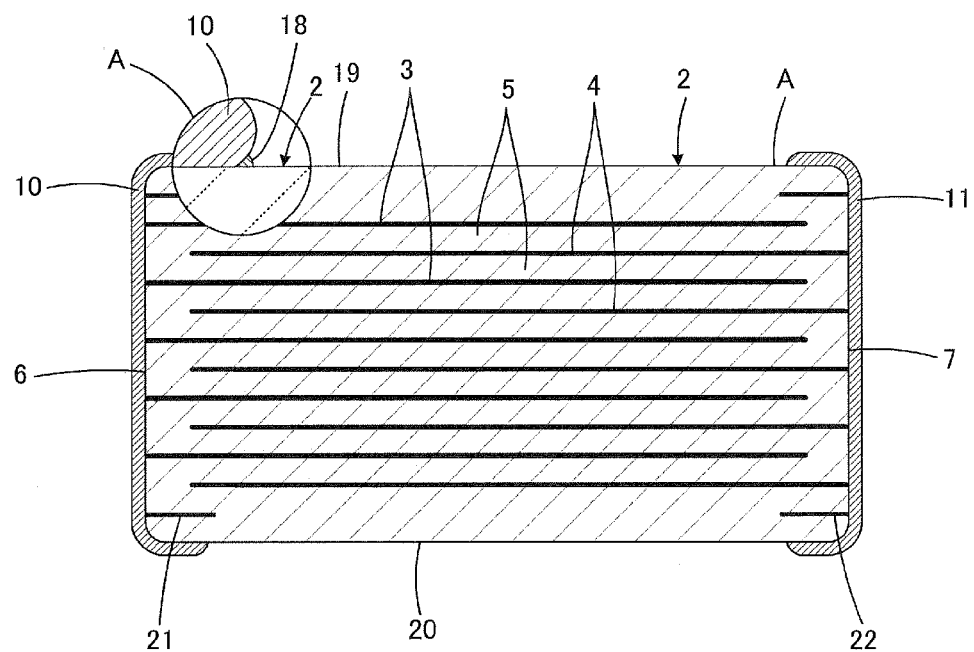
FIG. 4 is a cross-sectional view illustrating the component main body 2 with the water repellent agent removed, in the manufacturing process of the laminated electronic component 1 shown in FIG. 1, which also shows an enlarged portion of the laminated electronic component 1.
Figure 5:
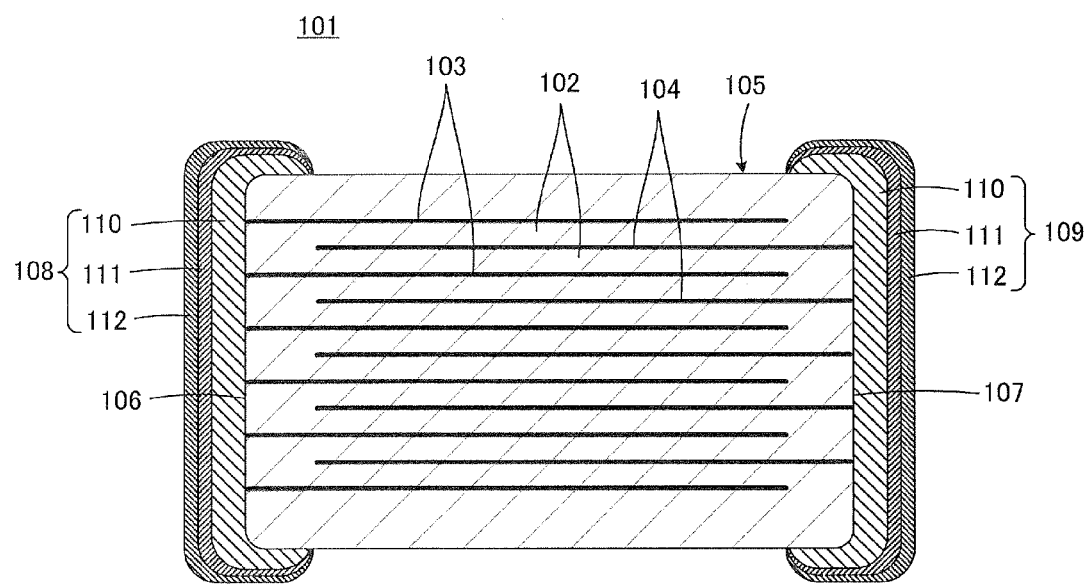
FIG. 5 is a cross-sectional view of a conventional laminated electronic component 101.

Next, the water repellent agent 18 applied onto the surfaces of the first plating layers 10 and 11 is removed. For the removal of the water repellent agent 18, for example, the component main body 2 with the first plating layers 10 and 11 formed is preferably immersed in a solvent which is capable of dissolving the water repellent agent 18, or the solvent is sprayed onto the entire surface of the component main body 2 with the first plating layers 10 and 11 formed. As a result of this step, as shown in an enlarged section in FIG. 4, the water repellent agent 18 is not completely removed and a portion remains so as to fill the gaps between the end edges of the first plating layers 10 and 11 on the principal surfaces 19 and 20 and side surfaces of the component main body 2, and the component main body 2. On the other hand, the water repellent agent 18 on the first plating layers 10 and 11 and on the exposed section of the principal surfaces 19 and 20 and side surfaces of the component main body is substantially entirely removed.

As described above, the water repellent agent 18 preferably remains only in the gaps, and it is thus not necessary to perform any additional process such as, for example, selectively spraying a solvent to the section other than the section A.

The water repellent agent 18 effectively prevents ingress of moisture from the gaps between the end edges of the first plating layers 10 and 11 and the principal surfaces 19 and 20 and side surfaces.

Next, the second plating layers 12 and 13 are formed. The second plating layers 12 and 13 are formed after the formation of the first plating layers 10 and 11, and thus, can be easily formed using a normal method. This is because locations to be plated have a conductive and continuous surface when the second plating layers 12 and 13 are formed.

In addition, since the water repellent agent 18 applied on the surfaces of the first plating layers 10 and 11 is removed, there is almost no water repellent agent 18 on the surfaces of the first plating layers 10 and 11. Therefore, during the formation of the second plating layers 12 and 13, the problem of deposition of a plating film being inhibited by the water repellent agent 18 is prevented. Furthermore, this enables the use of an agent having a strong water repellency as the water repellent agent 18, thereby contributing to further improvement in reliability.

In a preferred embodiment of the present invention, in order to form the second plating layers 12 and 13, the step of forming the solder barrier layers 14 and 15 preferably made of, for example, nickel, and the step of forming the solderability providing layers 16 and 17 preferably made of, for example, tin or gold, are sequentially performed.

Next, an experimental example will be described, which was performed to confirm the advantageous effects of preferred embodiments of the present invention.

In this experimental example, laminated ceramic capacitors as samples were manufactured in accordance with the following steps.
(1) Preparation of Component Main Body
(2) Electrolytic Copper Plating
(3) Heat Treatment
(4) Application and Removal of Water Repellent Agent
(5) Electrolytic Nickel Plating
(6) Electrolytic Tin Plating It is to be noted that cleaning with pure water was performed after each of the plating steps (2), (5), and (6).

The details of each of the steps (1) to (6) are described below.

(1) Preparation of Component Main Body

A component main body having a length of about 0.94 mm, a width of about 0.47 mm, and a height of about 0.47 mm defining a laminated ceramic capacitor was prepared in which insulator layers were made of a barium titanate based dielectric ceramic, internal electrodes included nickel as their main component, the insulator layer between the adjacent internal electrodes had a thickness of about 1.5 µm, and the number of the laminated internal electrodes was about 220. Furthermore, this component main body was provided with internal dummy conductors and external dummy conductors.

(2) Electrolytic Copper Plating

As plating baths, a copper strike bath shown in Table 1 below and a thick copper bath shown in Table 2 were prepared.

TABLE 1

| | Copper Strike Bath | |
|---|---|---|
| Plating Bath | Copper pyrophosphate | 14 g/liter |
| | Pyrophosphoric acid | 120 g/liter |
| | Potassium oxalate | 10 g/liter |
| | PH | 8.7 |
| | Bath Temperature | 25° C. |

TABLE 2

| | Thick Copper Bath | |
|---|---|---|
| | Pyro-Bright Process from C. Uyemura & Co., Ltd. | |
| Plating Bath | pH | 8.6 |
| | Bath Temperature | 55° C. |

Into a 300 ml horizontal rotating barrel, about 500 pieces of the component main bodies were input, and in addition, about 100 ml of conductive media having a diameter of about 0.7 mm was input. Then, the horizontal rotating barrel was immersed in the copper strike bath shown in Table 1, and a current was applied at a current density of about 0.10 A/dm$^2$ while rotating the horizontal rotating barrel at a barrel peripheral velocity of about 2.6 m/minute, thereby performing copper strike plating until a film thickness of about 1 µm was obtained.

Then, the same horizontal rotating barrel was immersed in the thick copper bath shown in Table 2, and a current was applied at a current density of about 0.30 A/dm$^2$ while rotating the horizontal rotating barrel at the same barrel peripheral velocity, thereby carrying out thick copper plating until a film thickness of about 5 µm was obtained.

(3) Heat Treatment

The component main body including the copper plating layer formed thereon as described above was subjected to a heat treatment at a temperature of about 800° C. for about 5 minutes.

(4) Application and Removal of Water Repellent Agent

Next, the component main body subjected to the heat treatment was immersed in a liquid including a water repellent agent as shown in Table 3 under reduced pressure for about 60 minutes, and then dried at about 105° C. for about 15 minutes and then about 180° C. for about 1 minute to apply the water repellent agent.

Next, as shown in Table 3, except for the specific samples, the samples were immersed in IPA (isopropyl alcohol) for 5 minutes to carry out a step of removing the water repellent agent.

TABLE 3

| Sample No. | Water Repellent Agent | Removal Step |
|---|---|---|
| 1 | A.WR (NICCA CHEMICAL CO., LTD.) Stock Solution | Yes |
| 2 | A.PC (NICCA CHEMICAL CO., LTD.) Stock Solution | Yes |
| 3 | A.WR (NICCA CHEMICAL CO., LTD.) Stock Solution | No |
| 4 | A.PC (NICCA CHEMICAL CO., LTD.) Stock Solution | No |
| 5 | Solution of A-WR (NICCA CHEMICAL CO., LTD.) diluted with IPA to 3 weight % | No |
| 6 | Water repellent agent for Sample 1, applied after tin plating | |
| 7 | Not Treated | — |

For sample 6 in Table 3, the water repellent agent for sample 1 was used, and applied after the tin plating described below, rather than after the copper plating described above.

(5) Electrolytic Nickel Plating

Next, a Watts bath (weakly acid nickel bath) was used and set at a temperature of about 60° C. and pH about 4.2 to perform electroplating at a current density of about 0.20 A/dm$^2$ for about 60 minutes, thereby forming a nickel plating layer having a thickness of about 4 μm on the copper plating layer.

(6) Electrolytic Tin Plating

Next, NB-RZS from Ishihara Chemical Co., Ltd. was used as a plating bath and set at a temperature of about 30° C. and pH about 4.5 to perform electroplating at a current density of about 0.10 A/dm$^2$ for about 60 minutes, thereby forming a tin plating layer having a thickness of about 4 μm on the nickel plating layer.

A humidity-proof reliability test (temperature: about 125° C., relative humidity: about 95%, applied voltage: about 6.3 V) was performed on the samples. Then, when the insulation resistance for each case of after a lapse of about 144 hours and after a lapse of about 288 hours was about 1 MΩ or less, the sample was regarded as a defective, thereby obtaining the number of defective samples with respect to the number of samples of 70. The results are shown respectively as "The Number of Defectives in Reliability Test (144 hours)" and "The Number of Defectives in Reliability Test (288 hours)" in Table 4.

In addition, the plated surface after the step of (5) Electrolytic Nickel Plating was observed by a microscope to evaluate the nickel plating property. When the underlying copper was observed even if only slightly, the sample was regarded as a defective, thereby obtaining the number of defectives with respect to the number of samples of 70. The results are shown as "The Number of Defectives in Ni Plating".

TABLE 4

| Sample No. | The Number of Defectives in Reliability Test (144 hours) | The Number of Defectives in Reliability Test (288 hours) | Ni (Plating) The Number of Defectives |
|---|---|---|---|
| 1 | 0 | 0 | 0 |
| 2 | 0 | 0 | 0 |
| 3 | 70 | 70 | 70 |
| 4 | 70 | 70 | 70 |
| 5 | 0 | 5 | 0 |
| 6 | 14 | 28 | 0 |
| 7 | 18 | 42 | 0 |

In Tables 3 and 4, samples 1 and 2 are examples within the scope of the present invention, whereas samples 3 to 7 are comparative examples outside the scope of the present invention.

First, for samples 3 and 4, while the strong water repellent agents were used as rough stock solutions, the removal steps for these water repellent agents were not performed. Thus, samples having defective plating were produced, and defective samples were also produced in the reliability test for a relatively short period of time of about 144 hours.

For sample 5, the diluted water repellent agent was used. Thus, even without performing the removal step for the water repellent agent, no defective sample was produced in the reliability test for a relatively short period of time of about 144 hours, whereas defective samples were produced in the reliability test for a relatively long period of time of about 288 hours.

For sample 6, sealing by the water repellent agent was not sufficient for the gaps between the end edges of the copper plating layers located on the principal surfaces and side surfaces of the component main body and the outer surface of the component main body, and defective samples were produced in the reliability tests.

For sample 7, the water repellent agent itself was not used. Thus, the results were inferior in terms of reliability, even as compared to sample 6.

In contrast to these samples, for samples 1 and 2, while the strong water repellent agents were used as rough stock solutions, the removal steps for these water repellent agents were performed. Thus, no plating defects were caused, and no defective samples were produced, not only in the reliability test for about 144 hours, but also in the reliability test for a relatively long period of time of about 288 hours.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A laminated electronic component comprising:
   a component main body having a stack structure and including a plurality of internal electrodes provided therein, each of the plurality of internal electrodes including exposed surfaces; and
   an external terminal electrode electrically connected to the plurality of internal electrodes and disposed on an outer surface of the component main body; wherein
   the external terminal electrode includes a first plating layer provided directly on the exposed surfaces of the plurality of internal electrodes in the component main body, and a second plating layer provided on the first plating layer; and a water repellent agent filled in a gap between an end edge of the first plating film on the outer surface of the component main body and a section of the outer surface of the component main body on which the end edge of the first plating layer is located.

2. The laminated electronic component according to claim 1, wherein an interdiffusion layer is provided in a region with a length of about 2 μm or more from a boundary between the internal electrode and the first plating layer.

3. The laminated electronic component according to claim 1, wherein the first plating layer includes a plating layer including copper as its main component, and the second plating layer includes a plating layer including nickel as its main component, and further comprising a plating layer including tin or gold as its main component disposed on the second plating layer.

4. The laminated electronic component according to claim 1, wherein the component main body has a substantially rectangular parallelepiped shape including a pair of principal surfaces opposed to each other, a pair of side surfaces opposed to each other, and a pair of end surfaces opposed to each other, the end surfaces serving as the exposed surfaces of the internal electrodes, and the first plating layer is provided on the pair end surfaces, and arranged so that end edges of the first plating layer are disposed on the pair principal surfaces and the pair of side surfaces, which are adjacent to the pair of end surfaces.

* * * * *